(12) United States Patent
Kraemer et al.

(10) Patent No.: US 6,947,363 B2
(45) Date of Patent: Sep. 20, 2005

(54) SUPERRESOLUTION IN PERIODIC DATA STORAGE MEDIA

(75) Inventors: Darren Kraemer, 33 Himount Drive, Toronto, Ontario (CA), M2K 1X3; Bradley Siwick, Toronto (CA); R. J. Dwayne Miller, 21 Elmwood Avenue South, Port Credit, Ontario (CA), L5G 3J6

(73) Assignees: R. J. Dwayne Miller, Port Credit (CA); Darren Kraemer, Toronto (CA); Brad Siwick, Toronto (CA)

( * ) Notice: Subject to any disclaimer, the term of this patent is extended or adjusted under 35 U.S.C. 154(b) by 504 days.

(21) Appl. No.: 10/016,133

(22) Filed: Dec. 17, 2001

(65) Prior Publication Data

US 2002/0136133 A1 Sep. 26, 2002

Related U.S. Application Data

(60) Provisional application No. 60/258,302, filed on Dec. 28, 2002.

(51) Int. Cl.[7] .................................................. G11B 7/00
(52) U.S. Cl. ............................ 369/53.33; 369/47.17; 369/59.1; 369/103
(58) Field of Search ........................ 369/53.33, 53.11, 369/53.22, 53.27, 53.31, 53.41, 53.44, 59.1, 59.17, 59.21, 59.27, 47.17

(56) References Cited

U.S. PATENT DOCUMENTS

| | | | |
|---|---|---|---|
| 5,084,858 A | * | 1/1992 | Maeda .................... 369/53.33 |
| 5,740,184 A | | 4/1998 | Heanue et al. |
| 5,862,269 A | | 1/1999 | Cohen et al. |
| 5,889,752 A | | 3/1999 | Maeda et al. |
| 5,952,131 A | | 9/1999 | Kumacheva et al. |
| 6,337,117 B1 | * | 1/2002 | Maenosono et al. ....... 428/64.1 |
| 6,612,532 B1 | * | 9/2003 | Paulus ....................... 248/317 |

FOREIGN PATENT DOCUMENTS

| | | |
|---|---|---|
| EP | 0400899 | 12/1990 |
| EP | 0402180 | 12/1990 |
| EP | 0524043 | 1/1993 |
| EP | 0569718 | 11/1993 |
| EP | 0959433 | 11/1999 |

OTHER PUBLICATIONS

Kalinina, O. et al., A core–shell approach to producing 3D polymer nanocomposites: Macromolecules, American Chemical Society, Easton, US, vol. 32, No. 12, 1999, pp. 4122–4129.

(Continued)

Primary Examiner—David L. Ometz
Assistant Examiner—J. L. Ortiz-Criado
(74) Attorney, Agent, or Firm—Lynn C. Schumacher; HIll & Schumacher

(57) ABSTRACT

This invention provides a method of acquisition of binary information that has been stored physically in a periodic storage medium. The method, referred to as matrix-method deconvolution (MMD), is useful for use with optical storage media using an optical addressing system that reads and writes binary information in a periodic array of nanoparticles. With this MMD method, the density of existing memory systems can be boosted to between 10 and 100 Terabytes of data per cubic centimeter. This matrix-method deconvolution method compensates for the effects of the optical addressing system's point spread function. Prior knowledge of a system's point spread function and inter memory-center spacing is used.

40 Claims, 8 Drawing Sheets

Definitions of r, the spacin between the bits, and R, the radius o the diffraction pattern.

Basis vectors (x,y)
|a| = |b c| | = | =r
a = ( 0, r)
b = (sqrt(3)/2*r, r/2)
c = (sqrt(3)*r, 0)

Basis vectors and o
the Lattice Translations

OTHER PUBLICATIONS

Siwick, B.J. et al., "Polymeric nanostructured material for high–density three–dimensional optical memory storage", Journal of Applied Physics, Nov. 15, 2001, AIP, USA, vol. 90, No. 10., pp. 5328–5334.

Lindek, Steffen, Pick, Ranier and Stelzer, Ernst H.K., "Confocal Theta Microscope With Three Objective Lenses", American Institute of Physics, Rev. Sci. Instrum. 65 (11), Nov. 1994, pp. 3367–3372.

Wang M. M., Esener, S. C., McCormick, F. B., Cokgor, I., Dvornikov, A.S., and Rentzepis, P.M., "Experimental Characterization of a Two–Photon Memory", Opitcal Society of America, Optics Letters, Apr. 15, 1997, vol. 22, No. 8, pp. 558–560.

Denk, Winfried, Strickler, James H., and Webb, Watt W., "Two–Photon Laser Scanning Fluorescence Microscopy", American Association for the Advancement of Science, Science, New Series, vol. 248, Issue 4951, Apr. 6, 1990, pp. 73–76.

Sales, Tasso R. M., and Morris, G. Michael, "Fundamental Limits of Optical Superresolution", Optical Society of America, Optics Letters, vol. 22, No. 9, May 1, 1997, pp. 582–584.

Parthenopoulos, Dimitri A., and Rentzepis, Peter M., "Three–Dimensional Optical Storage Memory", American Association for the Advancement of Science, Science, New Series, vol. 245, Issue 4920, Aug. 25, 1989, pp. 843–845.

Davila, Carlos A., and Hunt, B. R., "Superresolution of Binary Images With a Nonlinear Interpolative Neural Network", Applied Optics, vol. 39, No. 14, May 10, 2000, pp. 2291–2299.

Grochmalicki, Jan, and Pike, Roy, Superresolution for Digital Versatile Discs (DVD's), Optical Socienty of America, Applied Optics, vol. 39, No. 34, Dec. 1, 2000, pp. 6341–6349.

Sales, Tasso R. M., and Morris, G. Michael, "Diffractive Superresolution Elements", Optical Society of America, vol. 14, No. 7, Jul. 1997, pp. 1637–1646.

Dvornikov, A. S., and Rentzepis, P. M., "Novel Organic ROM Materials for Optical 3D Memory Devices", Optics Communications, vol. 136, Mar. 1, 1997, pp. 1–6.

Pudavar, Haridas, Joshi, Mukesh P., Prasad, Paras N., and Reinhardt, Bruce A., "High–Density Three–Dimensional Optical Data Storage in a Stacked Compact Disk Format With Two–Photon Writing and Single Photon Readout", American Institute of Physics, Applied Physics Letters, vol. 74, No. 9, Mar. 1, 1999, pp. 1338–1340.

Sales, Tasso R. M., "Smallest Focal Spot", The American Physical Society, Physical Review Letters, vol. 81, No. 18, Nov. 2, 1998, pp. 3844–3847.

Kumacheva, Eugenia, Kalinina, Olga, and Lilge, Lothar, Three–Dimensional Arrays In Polymer Nanocomposites, Advanced Materials, Nov. 2, 1999, pp. 231–234.

* cited by examiner

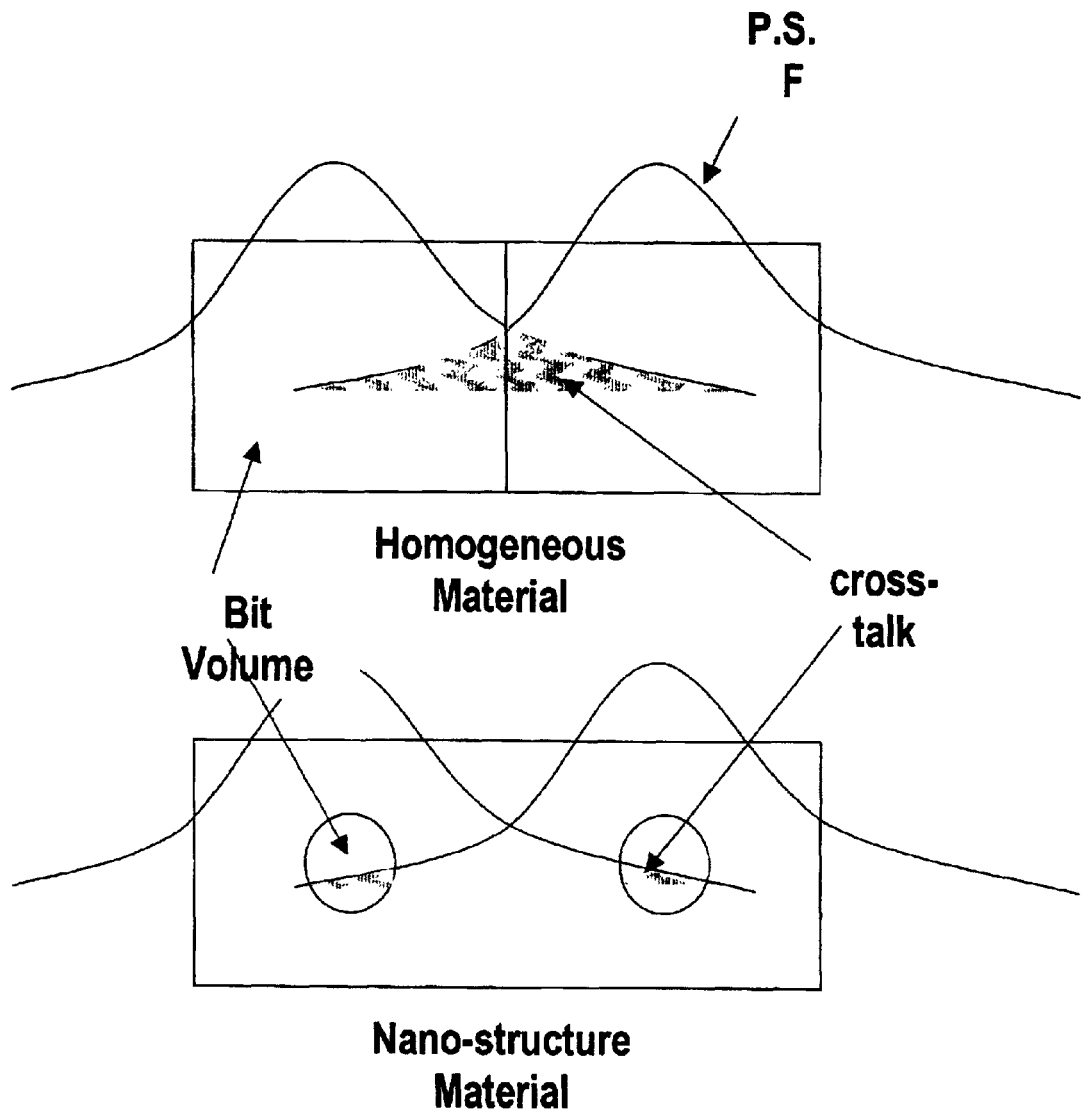
Figure 2. Nanostructured materials significantly reduce the cross-talk in the writing and reading processes by spatial isolation/separation of the active cores.
PRIOR ART

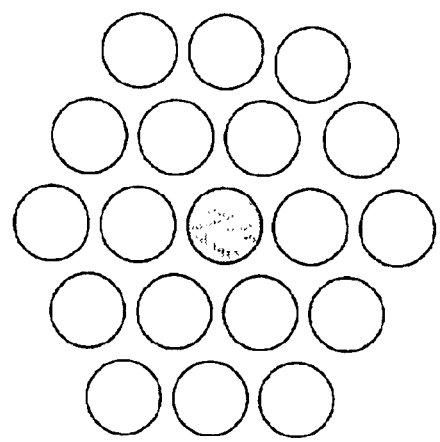
Figure 3a
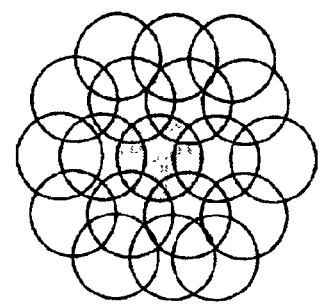  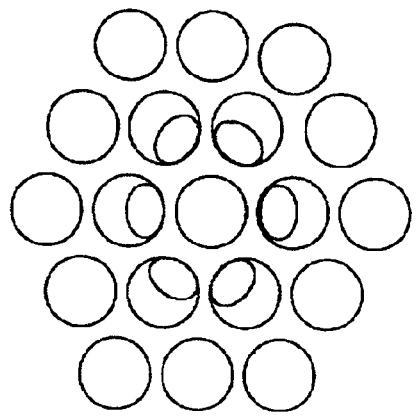
Figure 3b(i)    Figure 3 b (ii)
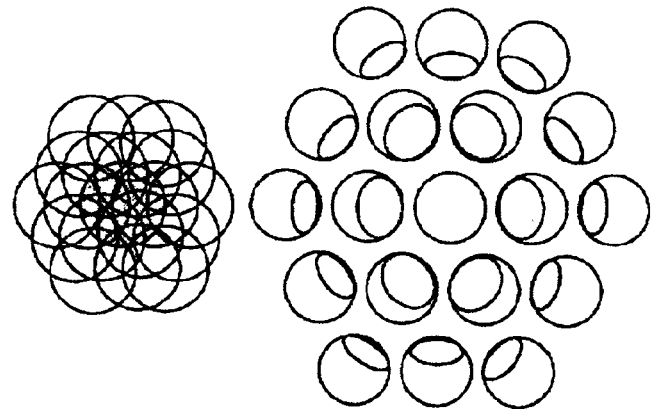
Fig 3c(i)    Fig 3c(ii)

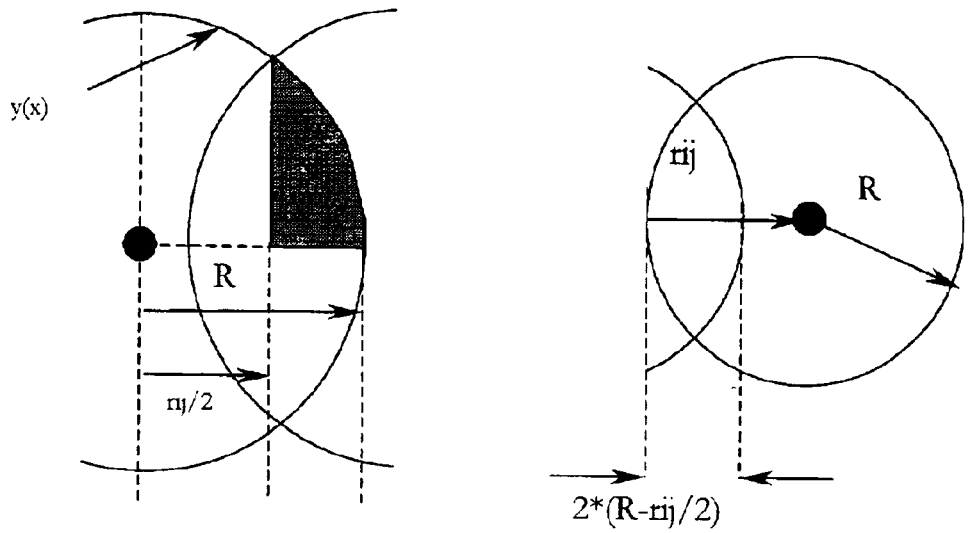
Figure 4a: Definitions of r, the spacin between the bits, and R, the radius o the diffraction pattern.
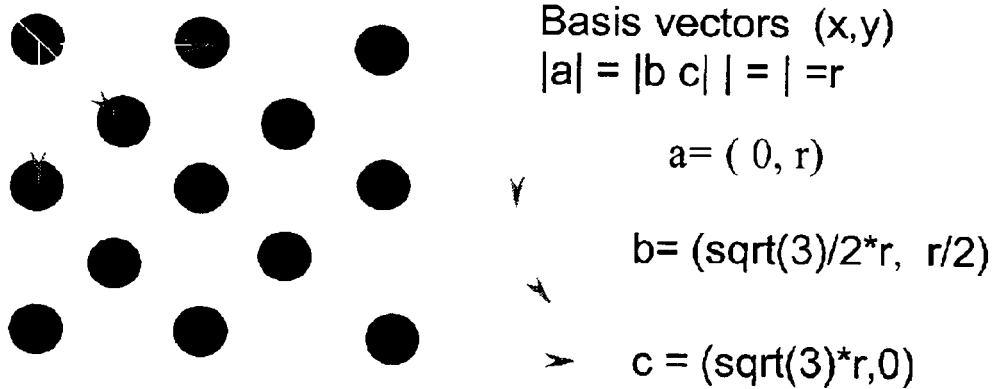
Basis vectors (x,y)
|a| = |b c| | = | =r
a= ( 0, r)
b= (sqrt(3)/2*r, r/2)
c = (sqrt(3)*r,0)
Figure 4b: Basis vectors and o the Lattice Translations

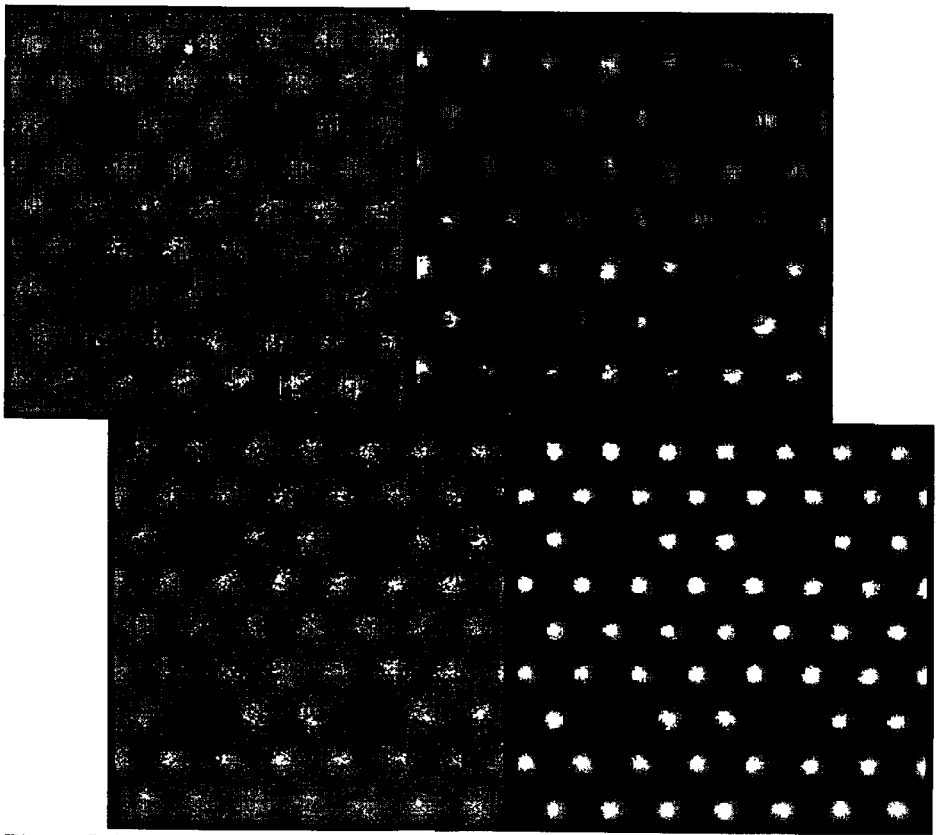

Figure 5 (top left) Laser confocal fluorescent microscopy image of nano-particle array.[2] The bits have core diameter 650 ± 20 nm and shell thickness 200 ± 5nm. $\lambda_{Fluorescence}$~500 nm, $\lambda_{two-photon}$= 844nm. Resolution is approximately 256x256 samples. A data pattern has been photo-bleached into material (top right) After filtering and deconvolution approximate Gaussian point spread function. (botttom right) simulation of equivalent data with a sine squared basis bit (bottom left) with simulated point-spread function of diameter, 750nm and signal to noise ratio of 10.

r ~ λ
Overlap = 0% r ~ λ/2
Overlap = 50%
Rayleigh Limit r ~ λ/4
Overlap = 75% r ~ λ/8
Overlap = 90%

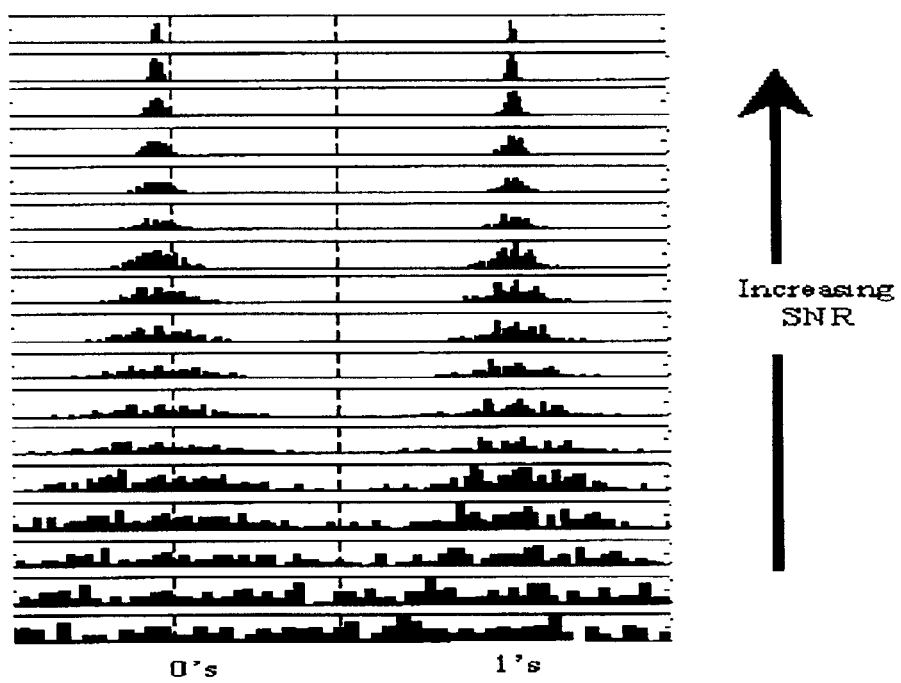
Figure 7: Bit distributions

SUPERRESOLUTION IN PERIODIC DATA STORAGE MEDIA

CROSS REFERENCE TO RELATED U.S. PATENT APPLICATION

This patent application relates to U.S. provisional patent application Ser. No. 60/258,302 filed on Dec. 28, 2000, entitled SUPERRESOLUTION IN PERIODIC OPTICAL DATA STORAGE.

FIELD OF THE INVENTION

This invention relates generally to the storage and acquisition of binary information that has been stored physically.

BACKGROUND OF THE INVENTION

The speed, capacity, and usage of computers have been growing rapidly for several decades. With the development of multimedia and digital communications, the quantity of data being processed has grown faster than the technology that supports it. These factors have given rise to a critical need for new modalities of high density memory. For example, data bases at major international laboratories such as CERN and medical centers are approaching requirements of petabit storage levels per year. Digital media will soon require terabit formats, (see S. Esener and M. Kryder, WTEC Panel Report 7 (1999) 5.2). It may well be that limitations in storing and retrieving data may ultimately limit progress in this key sector to science and technology.

Recently the inventors have investigated the unique properties of a polymer photonic crystal with respect to applications as a medium for high-density 3-D optical data storage for this expressed purpose, see B. Siwick, O. Kalinina, E Kumacheva, R. J. D Miller and J. Noolandi, Appl. Phys. 90 (2001) 5328. This new class of materials has the unique property that information can be confined in spatially modulated domains with well-defined Fourier components. The spatial order imposed on the data storage process is achieved by using nanocomposite polymers in which the optically active domains are localized in the center of self-assemblying latex particles through a two step (or multi-step) growth cycle. Core particles are formed by an optically active dye-labeled monomer. The cores are then subjected to a second stage of polymerization with a lower glass temperature that serves as the optically inactive outer buffer. The resulting particles show very good uniformity and are essentially monodispersed with respect to radii. This property facilitates the formation of hexagonally close packed films up to mm thickness with a very high degree of order. Upon annealing, the close-packed core-shell particles form a nanostructured material with the fluorescent particles periodically embedded into the optically inert matrix in a close-packed hexagonal structure, see E. Kumacheva, O. Kalinina, L. Lilge, Adv. Mater. 11 (1999) 231. The long range periodic order of these materials is demonstrated in FIGS. 1a), 1b) and 1c).

To store information in these materials, a two-photon laser scanning microscope was used to write information by photobleaching the optically active cores and, under much lower fluence, read out the resulting image. The optical properties of these nanocomposite polymers are essentially binary in nature, i.e., the optically active domains are separated by inactive regions with a square modulated cross section determined by the abrupt interface between the high and low temperature polymer blends. This binary modulation of the polymer's optically properties makes these materials ideal for storing binary information, as can be appreciated from FIGS. 1a), 1b) and 1c). The bleaching of the dye in the well defined spatial domains serves as part of the binary code. The sharp boundaries and high local concentration of fluorescent dye serves to enhance the contrast and readily define the bit storage. Equally important, the writing speeds can support GHz address speeds. Overall, a storage density approaching 1 Terabit/cc was successfully demonstrated as disclosed in B. Siwick, O. Kalinina, E Kumacheva, R. J. D Miller and J. Noolandi, Appl. Phys. 90 (2001) 5328.

Relative to conventional homogeneous storage media, the nanostructured periodic material is shown to increase the effective optical storage density by spatially localizing the optically active region and imposing an optically inactive barrier to cross-talk between bits. The basic principle that provides this unique property is shown schematically in FIG. 2. This feature alone leads to a significant increase in the storage density of nanocomposite polymers relative to homogeneous polymers, (B. Siwick, O. Kalinina, E Kumacheva, R. J. D Miller and J. Noolandi, Appl. Phys. 90 (2001) 5328). The aim of the current work is to explore the possibility of further taking advantage of the periodic spatial properties of these materials.

Conventional limits in optical resolution (Rayleigh criterion) assume no a priori knowledge of the location of an object(s). In the case of periodic materials, the objects of interest are confined to lattice points with a well-defined lattice spacing such that there is additional information available for signal processing. The periodic nature of the signal that would result from such structures is well suited to spatial phase sensitive detection methods, i.e. the underlying lattice period acts as a reference for signal processing. Signal-to-noise enhancements of several orders of magnitude are typically realized in related problems using optical heterodyne detection. The question is how far could the spatial resolution be improved by explicitly taking advantage of the underlying Fourier spatial components to nanocomposite materials. To this end, a post processing algorithm was developed that is optimal for extracting binary information from images of bit patterns in nanocomposite materials at densities far beyond the classic Rayleigh resolution limit. Under realistic noise conditions, this signal processing procedure should lead to a density increase of an order of magnitude.

The storage density limit in optical systems is determined by the resolution of the imaging system. When observed through an optical instrument such as a microscope, the image of an individual bit appears as an intensity distribution. The width of this distribution or diffraction pattern is proportional to the wavelength $\lambda$ of the light in the imaging system. If the bits are separated by a distance $\lambda$, then there will be little interference between the diffraction patterns of the bits. We will refer to this spacing as normal density. As the bit separation is reduced, it becomes harder to distinguish individual bits. When the central maximum of one bit's image falls on the first minimum of a second bit, the images are said to be just resolved. This limiting condition of resolution is known as Rayleigh's criterion. In other words, if the distance between bits is smaller than $\lambda/2$ the microscope will not be able to distinguish between two adjacent bits. We will refer to this spacing as the classical limit density.

A CD-ROM that holds a maximum of 650 Mbytes over an area of 50 $cm^2$ (radius 4 cm) has a density of 13 Mbytes/$cm^2$. For such systems which use a 780 nm (infrared) laser the normal density is around 20 Mbytes/$cm^2$. Hence, commercial CD-ROMs operate at about 60% of the normal density. The bit density of a DVD that uses a 650 nm (red) laser is $7.8 \times 10^8$ bits/cm². For this wavelength the normal density is around $1.64 \times 10^8$ bits/cm², and the classical limit density, is $9.5 \times 10^8$ bits/cm². The commercial DVD's operate near 80% of the classical limit density. Although the DVD's density is a great improvement (~7 times more data per disc) over the older CD-ROM technology, it is still limited by diffraction as expressed in the Rayleigh criterion.

When two diffraction patterns are superimposed, in order to satisfy the Rayleigh criterion, they must be separated by more than half the width of the central peak.

$$r_{ij} > \frac{1.22\pi z}{Rk_0} = \frac{1.22 z}{R}\left(\frac{\lambda_0}{2}\right) \text{ since } \lambda = \frac{2\pi}{k} \quad [1]$$

where z is x, R is y, and $\lambda_0$ is z. The minimum resolved separation distance ($r_{ij}$) is therefore proportional to half the wavelength. This relation defines the maximum density that can be stored in the image plane and is responsible for the $\lambda^{-2}$ scaling for 2-d optical storage. By taking advantage of confocal imaging to provide a $3^{rd}$ dimension, the maximum density scales as $\lambda^{-3}$. The above relation then defines the storage density for one page in the optical readout for 3-d memory and the confocal parameter defines the density of these pages along the optic axis. The density along the optic axis can be increased to a certain extent by using theta scans (see Steffen Lindek, Rainer Pick, Ernst H K Stelzer Rev. Sci. Instrum. 65, 3367 (1994)) however, the storage density scales quadratically for in-plane components and provides far greater gain in storage density.

It would be very advantageous to have a technique that allows data to be read at resolutions beyond the Rayleigh criterion.

SUMMARY OF THE INVENTION

Accordingly, one object of the present invention is to provide a technique which allows data to be read from a periodic data storage media at resolutions beyond the Rayleigh criterion.

Another object of the present invention is to provide a method to resolve structures in images beyond the Rayleigh criterion, as well as to extract the binary information contained therein. Error Free determination of this information at bit densities exceeding the classical limit would thus imply, an effective "super-resolution".

For a periodic lattice memory system, the superresolution or MMD method disclosed herein is achieved by post-processing the images of two-dimensional pages of memory, either recorded simultaneously or time-averaged (as with one-dimensional beam systems). This post-processing technique, described herein, is referred to as matrix-method deconvolution, since it compensates for the effects of the imaging system's point spread function. Prior knowledge of a system's point spread function and interbit spacing is used. Also the center co-ordinate of at least one bit must be determined to set the effective phase of the spatially modulated signal.

The present invention provides a method of reading binary information stored in a storage medium, comprising:

a) providing a storage medium having n memory-centers each with a known position and the memory-centers having substantially the same physical dimensions;

b) accessing said storage medium with an addressing system and measuring for each memory-center a scalar signal intensity $I_m$ emitted from a pre-selected region which is centered on the known position of said memory-center; and c) extracting the stored binary information by calculating bit values $b_n$ for all memory-centers using an equation $\underline{B}=C^{-1}\underline{I}/I_o$, wherein $I_o$ is a predetermined normalizing factor, $\underline{I}=(I_1, I_2, \ldots, I_n)$ is an array of said scalar intensities for all memory-centers, and $\underline{B}=(b_1, b_2, \ldots, b_n)$ is an array of bit values, and C is a predetermined cross-talk matrix of $n^2$ elements where each element represents a cross-talk between said pre-selected regions.

In this aspect of the method, the value of each matrix element may be defined as a function of a spacing between memory-centers i and j given by $$C_{ij}=f(r')=f(|\underline{r}_i-\underline{r}_j|)=f(R_{ij})$$

where f(r') is defined as a cross-talk function, and wherein said cross-talk matrix C is calculated by applying said cross-talk function to each element of a matrix R that contains all inter-memory-center spacings $R_{ij}=r'=|\underline{r}_i-\underline{r}_j|$.

In this aspect of the method the cross-talk function f(r') may be derived from an intensity distribution within a preselected region $I_0(q_m)$, $$f(r') = \oint d\underline{q} I_0(q_i) \cap I_0(q_j)$$

where $q_m$ defines coordinates of the intensity distribution of the preselected region of the mth memory-center.

In this aspect of the invention a binary value for each memory-center is calculated from a corresponding bit value by a process wherein the $n_1$ highest bit values are assigned a binary value of '1' and all others are assigned a binary value '0' based upon an equation relating the population of '1' valued memory-centers, $$n_1 = \sum_{j=1}^{N} \frac{Ij}{I_0} = \frac{I_N^{total}}{I_0}$$

In another aspect of the invention there is provided a method of reading binary information stored in a storage medium, comprising:

a) providing a storage medium having n memory-centers each with a known position and the memory-centers having substantially the same physical dimensions;

b) accessing said storage medium with an addressing system and measuring for each memory-center a scalar signal intensity $I_m$ emitted from a pre-selected region which is centered on the known position of said memory-center and having an intensity distribution defined by an impulse response of the addressing system and an effective distribution of the signal stored within the addressed memory-center; and c) extracting the stored binary information by calculating bit values $b_n$ for all memory-centers using an equation $\underline{B}=C^{-1}\underline{I}/I_o$, wherein $I_o$ is a predetermined normalizing factor, $\underline{I}=(I_1, I_2, \ldots, I_n)$ is an array of said scalar intensities for all memory-centers, and $\underline{B}=(b_1, b_2, \ldots, b_n)$ is an array of bit values, and C is a predetermined cross-talk matrix of $n^2$ elements where each element represents a cross-talk between said pre-selected regions.

The present invention also provides a method of reading binary information stored in an optical storage medium, comprising:

a) providing an optical storage medium having n memory-centers each with a known position and the memory-centers having substantially the same physical dimensions;

b) accessing said optical storage medium with an optical addressing system and measuring for each memory-center a total optical intensity $I_m$ emitted from a pre-selected region which is centered on the known position of said memory-center and having an optical intensity distribution within a single pre-selected region $I_0(q)$ defined by a point spread function of the optical addressing system and an intensity distribution of the memory-center itself defined by an optical response of a single memory-center as imaged through an idealized optical addressing system having an infinitely small point spread function; and c) extracting the stored binary information by calculating bit values $b_n$ for all memory-centers using an equation $\underline{B}=C^{-1}\,\underline{I}/I_o$, wherein $I_o$ is a predetermined normalizing factor, $\underline{I}=(I_1, I_2, \ldots, I_m, \ldots, I_n)$ is an array of said scalar intensities for all memory-centers, and $\underline{B}=(b_1, b_2, \ldots, b_n)$ is an array of bit values, and C is a predetermined cross-talk matrix of $n^2$ elements where each element represents a cross-talk between said pre-selected regions.

An advantage of the method of the present invention is that it removes the data storage limit classically imposed by the Rayleigh criterion with the only limit of data retrieval being related to noise conditions rather than density.

BRIEF DESCRIPTION OF THE DRAWINGS

The method of the present invention will now be described, reference being had to the accompanying drawings, in which:

FIG. 2 shows how a memory medium made of nanostructured materials significantly reduces the cross-talk in the writing and reading processes by spatial isolation/separation of the active memory centers compared to homogenous memory storage materials;

FIG. 3a shows the Regions of Interest (ROI) with no overlap between ROI's

FIG. 3b(i) shows the memory-centers or bits are close enough that ROI's overlap a little, 3b(ii) shows the resulting cross-talk between the ROI from the central ON bit;

FIG. 3c(i) shows the memory centers close enough so there is high overlap of the ROI's, 3c(ii) shows the resulting cross-talk between the ROIs in 3c(i);

FIG. 4a illustrates the definitions of r, the spacing between the memory centers or bits, and R, the radius of the diffraction pattern;

FIG. 4b shows the basis vectors and the lattice translations for the periodic storage memory where the dark circles represent the array of periodic memory centers;

FIG. 5 (top left) shows a laser confocal fluorescent microscopy image of a nanocomposite particle array in which the memory centers have a core diameter 650±20 nm and shell thickness 200±5 nm. $\lambda_{Fluorescence}\sim 500$ nm, $\lambda_{two-photon}=844$ nm, the resolution is approximately 256×256 samples, in which a data pattern has been photobleached into material (top right); after filtering and deconvolution approximate Gaussian point spread function is shown in the bottom right, and at the bottom left a simulation of equivalent data with a sine squared basis bit is shown with simulated point-spread function of diameter, 750 nm and signal to noise ratio of 10;

FIG. 7 shows bit distributions, when the MMD method is applied to simulated images the output values of the $B_n$ vector tended to take on two distributions around 1 and 0.

DETAILED DESCRIPTION OF THE INVENTION

Figure 1A:
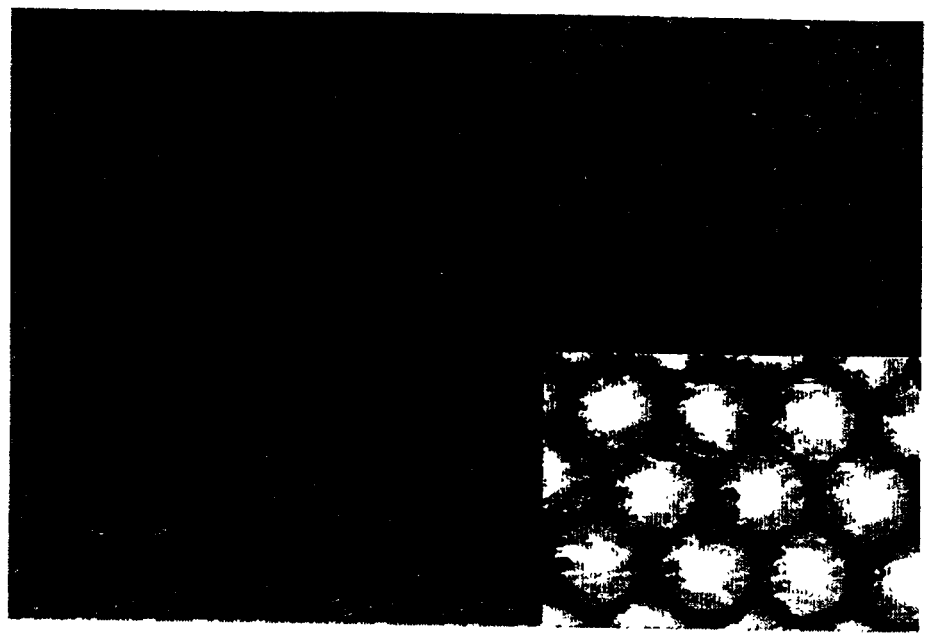
FIG. 1a shows a structure of the addressed plane of a nanocomposite memory storage medium located at the distance 200 microns from the top surface, the scale bar is 5 microns and the particles have 500 nm diameter cores and 250 nm thick shells.
Figure 1B:
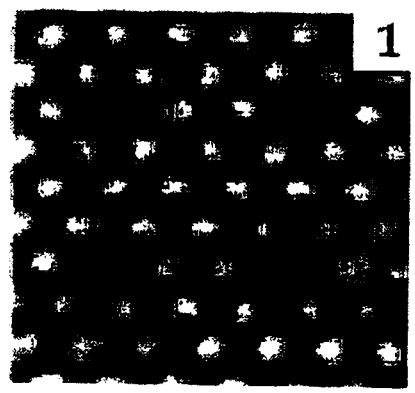
FIG. 1b) shows the structure of the addressed and adjacent layers of the nanocomposite storage medium of FIG. 1a) studied by 2-photon confocal microscopy.
Figure 1C:
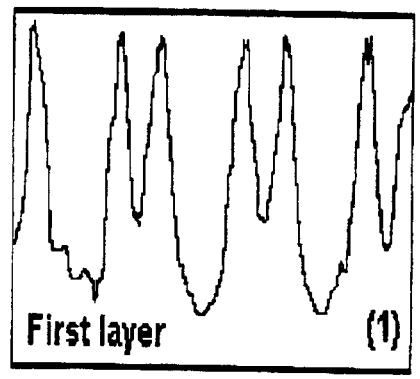
FIG. 1c) shows fluorescence intensity profiles for the addressed and neighboring planes of FIGS. 1a) and 1b)
Figure 6A:
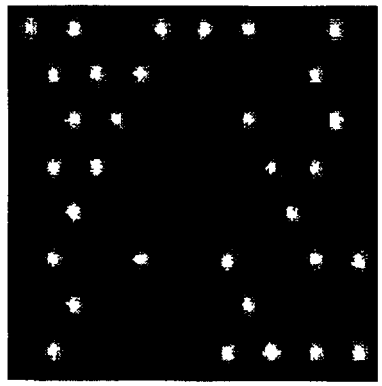
FIGS. 6a, 6b, 6c and 6d show increasing overlap in random data at various densities.
Figure 6B:
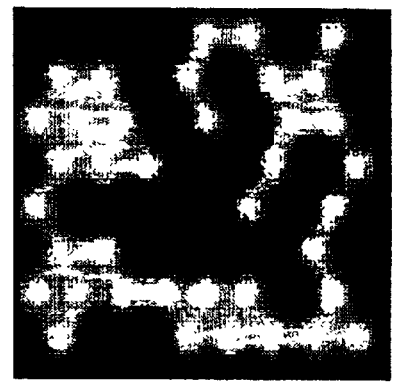
Figure 6C:
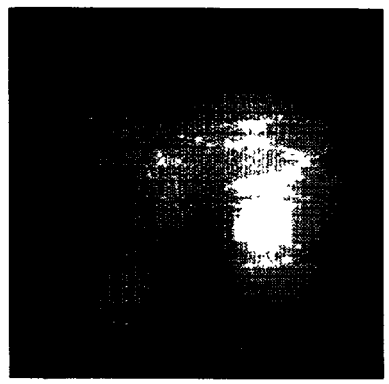
Figure 6D:
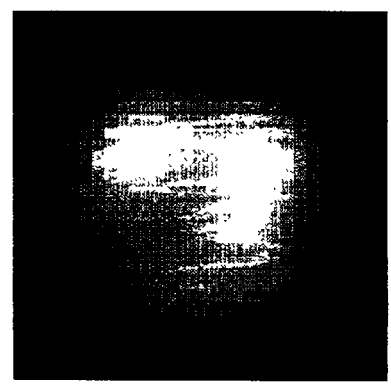

A goal of the present method is not to resolve structures in the images beyond the Rayleigh criterion, but rather to extract the binary information contained therein. Error Free determination of this information at bit densities exceeding the classical limit would thus imply, an effective "super-resolution".

In the present method, for a periodic lattice memory system, superresolution is achieved by post-processing the images of two-dimensional pages of memory, either recorded simultaneously or time-averaged (as with one-dimensional beam systems). This post-processing technique, described herein is referred to as matrix-method deconvolution (MMD), since it compensates for the effects of the imaging system's point spread function. Prior knowledge of a system's point spread function and inter-bit spacing is needed. Also the center co-ordinate of at least one bit must be determined to set the effective phase of the spatially modulated signal.

Matrix-Method Deconvolution (MMD)

We define the Region of Interest (ROI or pre-determined region) in an image of a bit to be that area encompassing the first (and most significant) maximum of the bit pattern. FIG. 3a shows the situation of no overlap between ROI's, FIG. 3b(i) shows memory centers being close enough so that ROI's overlap a little and FIG. 3b(ii) shows the resulting cross-talk between the ROI's from the central ON bit or memory center. FIG. 3c(i) shows highly overlapping ROI's and FIG. 3c(ii) shows the resulting cross-talk between the ROI's. Since this information can be reconstructed as a Fourier series of the lattice period, the pattern appears as an effective diffraction pattern to this periodic function and will be referred to as the bit diffraction pattern. The total detected intensity $I_m$ within the mth ROI ultimately determines the corresponding binary value. At densities in which there is an overlap (cross-talk) between the ROI's, the total intensities $I_m$ will increase by an amount related to the proximity between bits, such that:

$$I_x = I_0 \sum_n c_{xn} B_n \qquad [2]$$

where $B_N$ is the binary value of the nth bit, $I_0$ is the maximum intensity within an isolated ROI and $c_{xn}=c_{nx}=f(r_n-r_x)$ is the cross-talk coefficient.

If we include all of the bits in an array of N bits, we have a system of N equations and N unknowns.

$$I_1 = I_0 \times (B_1 + c_{12}B_2 + c_{13}B_3 \ldots + c_{1N}B_N)$$ [3]
$$I_2 = I_0 \times (c_{12}B_1 + B_2 + c_{23}B_3 \ldots + c_{2N}B_N)$$
$$\vdots$$
$$I_N = I_0 \times (c_{N1}B_1 + c_{N2}B_2 + c_{N3}B_3 \ldots + B_N)$$

In matrix form, these equations can be expressed as $$C_{nm}B_m = I_n/I_0$$ [4]

where C is an n×n matrix that shall be called the cross-talk matrix. The overlap leading to cross-talk between bits is shown schematically in FIG. 3.

To extract data from an image, we measure the intensities within each ROI, and calculate the bit values using the inverse of the previous equation:

$$B_m = C_{nm}^{-1} I_n/I_0$$ [5]

C and $I_0$ are constant for a given combination of readout frequency and bit density, and can be calculated a priori if the function $f(r_{jk})$ is applied to an array of inter-bit distances, $r_{jk} = r_j - r_k$.

Matrix Construction and the Cross-talk Function

The cross-talk function $f(r_{jk})$ is determined by the intensity distribution $I_o(x,y)$ of a bits image within its ROI, see FIG. 4a, $$f(r_{ij}) = 4 \int_{r_{ij}/2}^{R} \int_{0}^{y(x)} I_0(x, y) \, dy \, dx$$ [6]

or for discrete pixels $$f(r) = 4 \sum_{r/2}^{R} \sum_{0}^{y(x)} I_0(x, y)$$ [7]

With higher resolutions, it was possible to approximate the cross-talk function $f(r_{ij})$ with a polynomial fit to speed up calculations, but for lower resolutions the pixels make this smooth function very jagged, and instead, a look-up table was generated.

For each unique combination of bit size, spacing and point-spread function, a different matrix has to be generated. Since there are $N^2$ components in $C_{ij}$, the theoretical matrix construction is a second order algorithm. However, it can be reduced to an NlogN order algorithm by taking advantage of the periodic lattice. To generate the cross-talk matrix, an array was created for each bit containing the distance between it and the other bits; $R_{ij} = |r_{ij}|$ is also an n×n matrix. Then the cross-talk function $f(r_{ij})$ was applied to each element of R.

The first row of R corresponds to the distances between the first bit and all others bit. This is calculated using integer combinations of lattice basis vector as shown schematically in FIG. 4b, $$\underline{R}_{1j} = A_j \underline{a} + B_j \underline{b} + C_j \underline{c}.$$ [8]

Then the jth row was calculated by transforming the origin from the first bit to the jth, i.e., $$|R_{jk}| = |\underline{R}_{1k} - \underline{R}_{1j}|$$ [9]

Once density specifications are chosen for a system, the cross-talk matrix can be experimentally determined by recording the ROI intensities when only one bit in the system is "on.". The intensities measured within all other ROI correspond to one row of the cross-over matrix. All subsequent rows are lattice vector translations of the first.

As stated above, the cross-talk matrix has $N^2$ elements. If $N^2$ instructions must be executed to access N bits, the speed of the memory system will be very slow. However, for values of N much larger than the number of overlapping diffraction patterns within a single ROI, the overlap matrix will be very sparse. As the size of N increases the matrix becomes increasingly sparse and fewer calculations are necessary to extract the information.

It should be noted that when memory is within the classical limit density, it is possible to extract the bits with a simple algorithm that compares the intensities of the ROI to a set threshold of say $nI_0/2$ where n is the number of nearest neighbors. Yet even at these classical densities, there are advantages to using the MMD extraction procedure. It calculates each bit as a function of the intensities of the surrounding bits, like a moving average/autogain algorithm, and further enhances the signal to noise as will be discussed below.

Simulation of Experimental Results

To simulate the two-photon confocal flourescence microscopy images of data stored in nano-structured polymer, we assumed a bit basis function: the first peak of a radially symmetric cosine squared function, $$S(x, y) = \cos^2\left(\frac{\pi}{2R}\sqrt{\left(x - \frac{R}{2}\right)^2 + \left(y - \frac{R}{2}\right)^2}\right)$$ [10]

$$\text{for } \left(x - \frac{R}{2}\right)^2 + \left(y - \frac{R}{2}\right)^2 \leq R^2$$

= 0 (ignores second order maxima)

$$\text{for } \left(x - \frac{R}{2}\right)^2 + \left(y - \frac{R}{2}\right)^2 \geq R^2$$

This function was used as the basis to construct simulated close packed hexagonal lattices of random binary data and is shown in FIG. 5. Simulations were conducted by two different methods, to demonstrate different situations. In both methods, the diffraction of the bit basis was calculated by convolving with an approximate Gaussian point-spread function.

$$I_0(x,y) = I_{PSF}(x,y) * S(x,y) = \int \int I_{PSF}(x,y) S(x'-x, y'-y) dx' dy'$$

where $I_{PSF}$ is a spatial distribution of the impulse response and S(x,y) is the optical intensity distribution of the single memory-center as measured through an idealized optical addressing system.

Simulation A

The properties of the imaging system were held constant and the information storage density was varied. Hence, the radius of the diffraction pattern was kept constant and the bits were moved closer together. The samples per unit area, the area of the ROI, and the magnitude of each diffraction pattern is held constant. When the profile of diffraction patterns are overlapping by 50%, the distance between nearest neighbor bits is equal to half the diameter of the effective diffraction pattern ($\lambda/2$), and it becomes difficult to visually distinguish nearest neighbor bits. This point is illustrated schematically in the series showing increasing overlap in FIGS. 6a, 6b, 6c and 6d. This is the classical limit density. At 75%, the distance between bits is a quarter the diameter of the diffraction pattern ($\lambda/4$). An image of the same quantity of data is now one sixteenth the size of the uncompressed lattice. This translates to a 3-d density improvement over normal density of 256 times.

Simulation B

The density of stored information was held constant and the properties of the imaging system (PSF) were varied. Alternatively this procedure could be applied to a given imaging system, a given data density, by varying the wavelengths of light $\lambda_0$. The distance between the bits is held constant; while the width of the diffraction pattern is changed. As the point-spread function widens, the maximum intensity goes down. When the radius of the diffraction pattern is equal to the spacing between the bits, the effective cross-talk is 50%. This is the classical limit density for such a system, $\lambda=2\lambda_0$. At 75% effective cross-talk, $\lambda=3\lambda_0$, the diameter of the diffraction pattern is 3 times the distance between bits or, $$\text{Effective Cross-talk} = (1 - \lambda_0/\lambda) * 100 = \left(1 - \frac{d_{core}}{2G_{PSF}}\right) * 100 \quad [11]$$

where $d_{core}$ is the core diameter and $G_{PSF}$ is the FWHM of a gaussian point spread function. It should be emphasized that for this situation, an effective cross-talk of 100% requires an infinite point spread function; whereas in the previous simulation, 100% cross-talk implies that both bits were in the same location.

When the MMD was applied to simulated images the output values of the $B_n$ vector tended to take on two distributions around 1 and 0, as shown in the bit distributions of FIG. 7 which is a series of MMD output histograms. As the noise was increased, the width of both ON and OFF peaks in the histograms become wider, until a noise threshold was reached, at which point the two bands of values begin to overalp and the algorithm is no longer 100% accurate. Higher resolutions are affected less by the noise because it is averaged whe nthe intensities Ij are calculated from ROI with more bits contained within them. To extract information from the output, binary values must be assigned to each bit. Note that the population of 1's and 0's, is determined from the total intensity within the image.

$$n_1 = \sum_{j=1}^{N} I_j^{total}/I_0 \qquad n_2 = N - n_1 \quad [12]$$

The $n_1$ highest valued bits are '1' and the remaining $n_2 = N - n_1$ bits are considered '0'.

The resolving power of the MMD method was tested in both situations by adding different kinds and levels of noise to the simulated images. The signal-to-noise ratio was defined as the ratio between the signal power (total intensity) and the noise power. The results summarized in Table 1 were obtained by simulating arrays of 256 bits with each bit having a diameter of 16 pixels. These values were held constant throughout the simulations, so as not to skew the results. The effects of changing the numbers of pixels per bit disappear for large enough numbers of bits. The speed of the simulations was increased by choosing sampling parameters that were powers of two (allows an FFT algorithm to be used).

Figure 8A:
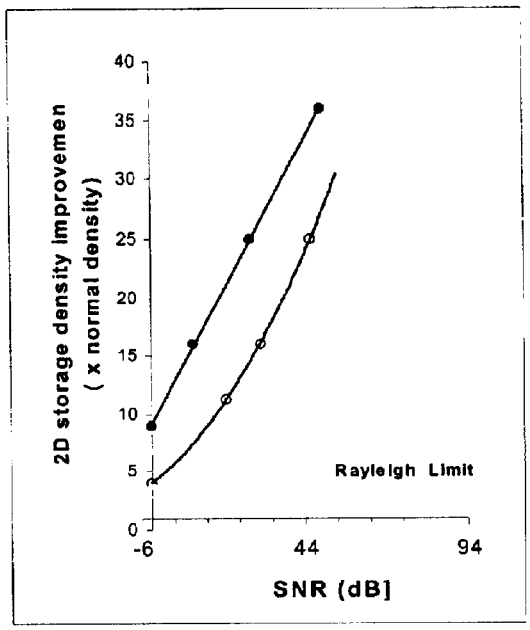
FIG. 8 shows plots of cross-talk % versus the signal to noise ratio for either simulation show the regions in which the presen MMD method of the present invention can improve the resolving power of memory acquisition systems.
Figure 8B:
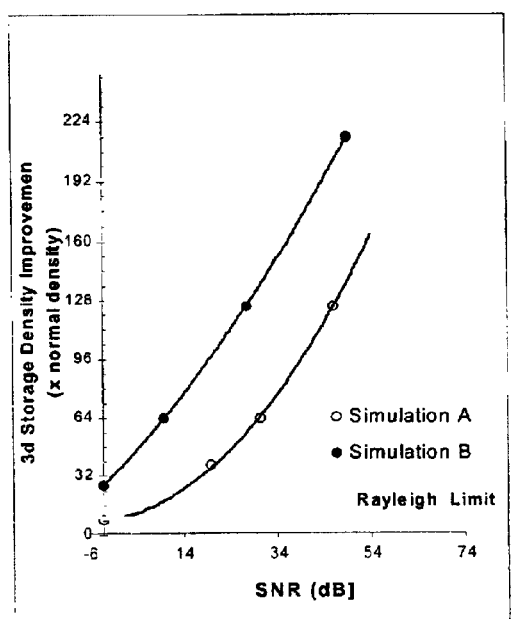
Figure 8C:
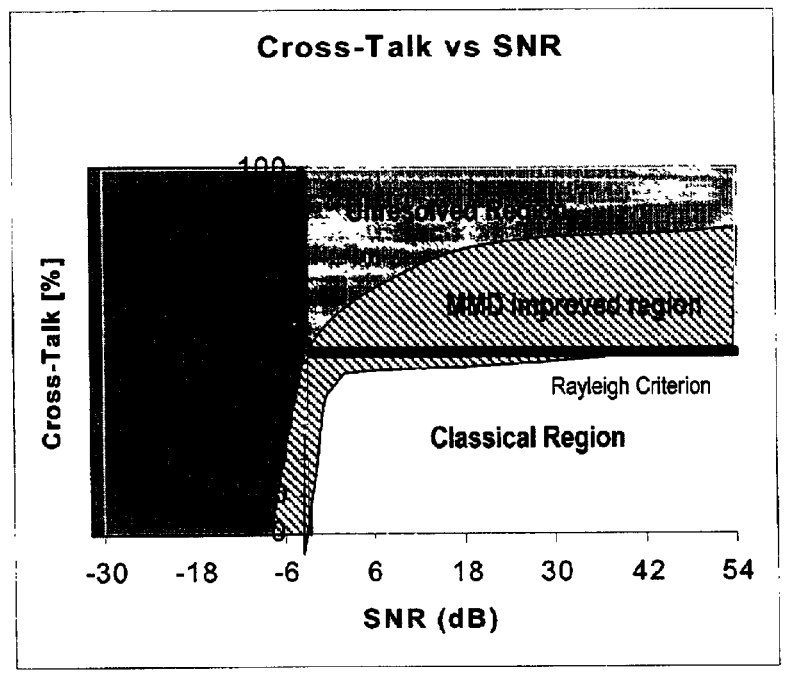

The noise threshold for error free determination of various configurations of both simulation A and B were measured by slowly decreasing the amount of noise until no errors were detected. The regions of Error Free Signal (EFS) demonstrated with the MMD are shown in FIG. 8.

TABLE 1

Summary of Noise Threshold Results:

| Effective Cross-talk [%] | Threshold SNR [dB] White Noise | 2D Density Improvement over normal density $\rho/\rho_{normal}$ |
|---|---|---|
| Simulation A | | |
| 0 | −3 | 0 |
| 30 | −3 | 2 |
| 50 | −3 | 4 |
| 70 | 20 | 11 |
| 75 | 30.5 | 16 |
| 90 | 46. | 100 |
| 99.9 | [∞] | [∞] |
| Simulation B | | |
| 0 | −3 | 0 |
| 30 | −3 | 2 |
| 50 | −3 | 4 |
| 67 | −3 | 9 |
| 75 | 10 | 16 |
| 80 | 27.5 | 25 |
| 83 | 49 | 36 |
| 99.9 | [∞] | [∞] |

The calculated improvements in information density are rather remarkable. This potential increase in bit density that can be accessed through such a binary extraction method should be gauged relative to other approaches being explored. A great deal of technical effort is presently being expended towards the development of blue diode lasers to increase optical data storage by approximately a factor of two. By simply changing the material to a nanocomposite and using the MMD approach it is possible to increase the density substantially beyond this target. The effectiveness of this technique is due to the following factors; knowledge of the effects of the imaging system's point spread functions, and the structure of the storage materials, i.e. the spatial location of each bit in the images.

It will be appreciated that the increase in data storage density is determined by the signal-to-noise in the read out. In particular, the width of the distributions in the algorithms output is related to the amount of noise in the image. This shows that the maximum resolvability of MMD will be dependent upon the system's signal-to-noise ratio, not the diffraction limit defined solely by the optics. The noise effects may be reduced with spatial and temporal filters to further suppress background noise and to build in redundancy into an error correction process.

There are several significant advantages of the matrix-method deconvolution (MMD) method disclosed herein. It can be exploited in a number of different applications. It can be used to read out data at longer wavelengths than the writing process. In order to write information beyond the diffraction limit of the reading wavelength requires that the data be written at shorter wavelengths as this step is still defined by diffraction limits of the optical imaging system. The writing process can be done with more expensive "blue lasers" to encode higher density information and MMD enables the read out at longer wavelengths with more cost effective systems amenable to multiple users. The MMD method can be used for reading low density memory, in a system that has high noise levels. It can be used to read from storage media systems with limited sampling capability. The MMD is only dependant on the total intensity within a ROI, hence the minimum sampling required is one sample per ROI. The matrix method of superresolution can work in either one, two, or three dimensions, whether the pre-selected regions of interest are lines, circles or spheres.

To summarize, a method has been disclosed herein to achieve error-free retrieval of binary information an order of magnitude beyond the Rayleigh limit. The method disclosed herein to achieve substantially error-free retrieval of binary information an order of magnitude beyond the Rayleigh limit, known as the matrix-method doconvolution method (MMD), was tested on images that simulated an existing optical memory system. It was found that the MMD method successfully compensates for the limitations of diffraction. Within current signal to noise limits in data read out, increases in optical density of more than 64 over the classical density are achievable, without considering further signal conditioning and optimization.

The exploitation of the intrinsically periodic nature of nanocomposite materials gives memory storage media made of these nanocomposites an advantage over homogeneous memory storage media in this regard. Notwithstanding, it will be understood that the present method can be used with homogenous or non nanocomposite media as well, although the biggest improvement is expected using nanocomposite memory storage media.

The underlying period of the nanocomposite lattice pro-vides an effective spatial reference for signal processing and extracting additional information. The combination of novel periodically photoactive materials and image processing may provide the solution to our ever-increasing demand for more memory at higher densities. Further, nanocomposite materials bring an extra dimension for optimizing the pho-toactive processes for a variety of applications. By spatially varying the viscosity and polarity of the nanocomposite, it is possible to increase photochemical quantum yields, create enhanced photo-electric index modulation, and minimize volume contraction in the recording process. All of these attributes can be further enhanced with respect to informa-tion density by explicitly exploiting the periodic nature of these materials, as illustrated with MMD approach for the simplest example of binary code.

One type of nanocomposite material is the periodic array of nano-particles being a polymer matrix comprising a three dimensional array of rigid polymeric cores embedded in a substantially transparent shell-forming polymer. each memory-center comprises a photosensitive constituent asso-ciated with each nano-particle. The photosensitive constitu-ent may be chromophores on, within or otherwise associated with the cores. More particularly the chromophores may be fluorescent molecules. The information is stored optically within the memory-centers in the storage medium and the addressing is an optical addressing system.

While the method has been described in detail with respect to optical storage media and addressing systems, it will be appreciated that the method of the present invention is not restricted to optical storage and addressing systems. For example, the storage medium and addressing system may be a magnetically based system in which the informa-tion is stored magnetically within the memory-centers in the storage medium, and wherein $I_m$ is the magnetic intensity within the pre-selected region of the mth memory-center. In this case each memory-center comprises a magneto-sensitive constituent associated with each nano-particle when the storage medium is comprised of a periodic array of nanoparticles. The polymeric cores may be rigid polymeric cores such as, but not limited to, latex spheres.

Thus in the broadest aspect the present invention provides a method of reading binary information stored in a storage medium, comprising providing a storage medium having n memory-centers each with a known position and the memory-centers having substantially the same physical dimensions;

accessing the storage medium with an addressing system and measuring for each memory-center a scalar signal intensity $I_m$ emitted from a pre-selected region which is centered on the known position of the memory-center; and extracting the stored binary information by calculating bit values $b_n$ for all memory-centers using an equation $\underline{B}=C^{-1}\underline{I}/I_o$, wherein $I_o$ is a predetermined normalizing factor, $\underline{I}=(I_1, I_2, \ldots, I_n)$ is an array of the scalar intensities for all memory-centers, and $\underline{B}=(b_1, b_2, \ldots, b_n)$ is an array of bit values, and C is a predetermined cross-talk matrix of $n^2$ elements where each element represents a cross-talk between the pre-selected regions.

The value of each matrix element may be defined as a function of a spacing between memory-centers i and j given by $$C_{ij}=f(r')=f(|\underline{r}_i-\underline{r}_j|)=f(R_{ij})$$

where f(r') is defined as a cross-talk function, and wherein the cross-talk matrix C is calculated by applying the cross-talk function to each element of a matrix R that contains all inter-memory-center spacings $R_{ij}=r'=|\underline{r}_i-\underline{r}_j|$.

The cross-talk function f(r') may be derived from an intensity distribution within a preselected region $I_0(q_m)$, $$f(r') = \oint dq I_0(q_i) \cap I_0(q_j)$$

where $q_m$ defines coordinates of the intensity distribution of the preselected region of the mth memory-center.

A binary value for each memory-center is calculated from a corresponding bit value by a process wherein the $n_1$ highest bit values are assigned a binary value of '1' and all others are assigned a binary value '0' based upon an equa-tion relating the population of '1' valued memory-centers, $$n_1 = \sum_{j=1}^{N} \frac{I_j}{I_0} = \frac{I_N^{total}}{I_0}$$

In all embodiments of the storage medium and addressing system, the storage medium may be a 1-, 2- or 3-dimensional storage medium. The storage medium may be addressed in 1-, 2- or 3-dimensions using the addressing system.

The storage medium may not necessarily be a nanocom-posite based storage medium and instead my be a homoge-neous optical storage medium in which the memory-centers are "written-in" with pre-selected dimensions.

Similarly, the storage medium may be a homogeneous magnetic storage material.

The foregoing description of the preferred embodiments of the invention has been presented to illustrate the prin-ciples of the invention and not to limit the invention to the particular embodiment illustrated. It is intended that the scope of the invention be defined by all of the embodiments encompassed within the following claims and their equiva-lents.

Therefore what is claimed is:

1. A method of reading binary information stored in a storage medium, comprising
   a) providing a storage medium having n memory-centers each with a known position and the memory-centers having substantially the same physical dimensions;
   b) accessing said storage medium with an addressing system and measuring for each memory-center a scalar signal intensity $I_m$ emitted from a pre-selected region which is centered on the known position of said memory-center; and c) extracting the stored binary information by calculating bit values $b_n$ for all memory-centers using an equation $\underline{B}=C^{-1}\underline{I}/I_o$, wherein $I_o$ is a predetermined normalizing factor, $\underline{I}=(I_1, I_2, \ldots, I_n)$ is an array of said scalar intensities for all memory-centers, and $\underline{B}=(b_1, b_2, \ldots, b_n)$ is an array of bit values, and C is a predetermined cross-talk matrix of $n^2$ elements where each element represents a cross-talk between said pre-selected regions and wherein the value of each matrix element is defined as a function of a spacing between memory-centers i and j given by $$C_{ij}=f(r')=f(|\underline{r}_i-\underline{r}_j|)=f(R_{ij})$$

where f(r') is defined as a cross-talk function, and wherein said cross-talk matrix C is calculated by applying said cross-talk function to each element of a matrix R that contains all inter-memory-center spacings $R_{ij}=r'=|\underline{r}_i-\underline{r}_j|$.

2. The method according to claim 1 wherein a first row of the matrix R corresponds to the distances between the first memory-center and all other memory-centers and is calculated using integer combinations of a basis vector $\underline{R}_{1n}=A_n\underline{a}+B_n\underline{b}+C_n\underline{c}$, and wherein the jth row is calculated by transforming the origin from the first memory-center to the jth memory-center, $|\underline{R}_{jn}|=|\underline{R}_{1n}-\underline{R}_{1j}|$.

3. The method according to claim 1 wherein the cross-talk function f(r') is derived from an intensity distribution within a pre-selected region $I_0(\underline{q}_m)$, $$f(r') = \oint d\underline{q} I_0(\underline{q}_i) \cap I_0(\underline{q}_j)$$

where $q_m$ defines coordinates of the intensity distribution of the pre-selected region of the mth memory-center.

4. The method according to claim 1 wherein a binary value for each memory-center is calculated from a corresponding bit value by a process wherein the $n_1$ highest bit values are assigned a binary value of '1' and all others are assigned a binary value '0' based upon an equation relating the population of '1' valued memory-centers, $$n_1 = \sum_{j=1}^{N} \frac{Ij}{I_0} = \frac{I_N^{total}}{I_0}.$$

5. The method according to claim 1 wherein said storage medium is a 1-, 2- or 3-dimensional storage medium.

6. The method according to claim 1 wherein said storage medium is addressed in 1-, 2- or 3-dimensions.

7. The method according to claim 1 wherein the storage medium includes a homogeneous optical storage material.

8. A method of reading binary information stored in a storage medium, comprising
a) providing a storage medium having n memory-centers each with a known position and the memory-centers having substantially the same physical dimensions;
b) accessing said storage medium with an addressing system and measuring for each memory-center a scalar signal intensity $I_m$ emitted from a pre-selected region which is centered on the known position of said memory-center and having an intensity distribution defined by an impulse response of the addressing system and an effective distribution of the signal stored within the addressed memory-center; and c) extracting the stored binary information by calculating bit values $b_n$ for all memory-centers using an equation $\underline{B}=C^{-1}\underline{I}/I_o$, wherein $I_o$ is a predetermined normalizing factor, $\underline{I}=(I_1, I_2, \ldots, I_n)$ is an array of said scalar intensities for all memory-centers, and $\underline{B}=(b_1, b_2, \ldots, b_n)$ is an array of bit values, and C is a predetermined cross-talk matrix of $n^2$ elements where each element represents a cross-talk between said pre-selected regions.

9. The method according to claim 8 wherein the intensity distribution within a pre-selected region $I_0(q)$, is calculated as the convolution of the impulse response with the effective distribution of the signal stored within the addressed memory-center, and wherein the value of each matrix element is defined as a function of a spacing between memory-centers i and j given by $$C_{ij}=f(r')=f(|\underline{r}_i-\underline{r}_j|)=f(R_{ij})$$

where f(r') is defined as a cross-talk function, and wherein said cross-talk matrix C is calculated by applying said cross-talk function to each element of a matrix R that contains all inter-memory-center spacings $R_{ij}=r'=|\underline{r}_i-\underline{r}_j|$.

10. The method according to claim 9 wherein intensity distribution is a spatial intensity distribution defined as, $$I_0(x,y)=I_i(x,y)*S(x,y)=\int\int I_i(x,y)S(x'-x,y'-y)dx'dy'$$

where $I_i$ is a spatial distribution of the impulse response and S is the effective distribution of the signal stored within a memory-center, and wherein the cross-talk function f(r') is derived from the spatial intensity distribution within the pre-selected regions $I_0(x,y)$, $$f(r') = 4*\int_{r/2}^{R}\int_{0}^{y(x)} I_0(x, y)dydx$$

where R is an effective radius of said spatial intensity distribution.

11. The method according to claim 10 wherein the spatial intensity distribution measured within the pre-selected regions include discrete pixels $I_0(x,y)=I^0_{x,y}$, and wherein the cross-talk function is $$f(r') = 4*\sum_{r/2}^{R}\sum_{0}^{y(x)} I^0_{x,y},$$

where R is the effective radius of the spatial impulse response.

12. The method according to claim 9 wherein the storage medium includes a homogeneous optical storage material.

13. The method according to claim 8 wherein a binary value for each memory-center is calculated from a corresponding bit value by a process wherein the $n_1$ highest bit values are assigned a binary value of '1' and all others are assigned a binary value '0' based upon an equation relating the population of '1' valued memory-centers, $$n_1 = \sum_{j=1}^{N} \frac{Ij}{I_0} = \frac{I_N^{total}}{I_0}.$$

14. The method according to claim 13 wherein a first row of the matrix R corresponds to the distances between the first memory-center and all other memory-centers and is calculated using integer combinations of a basis vector $\underline{R}_{1n}=A_n$ $\underline{a}+B_n\underline{b}+C_n\underline{c}$, and wherein the jth row is calculated by transforming the origin from the first memory-center to the jth memory-center, $|\underline{R}_{jn}|=|\underline{R}_{1n}-\underline{R}_{1j}|$.

15. The method according to claim 8 wherein the information is stored optically within the memory-centers in the storage medium, and wherein $I_m$ is the total optical intensity within the pre-selected region of the mth memory-center.

16. The method according to claim 8 wherein the information is stored magnetically within the memory-centers in the storage medium, and wherein $I_m$ is the magnetic intensity within the pre-selected region of the mth memory-center.

17. The method according to claim 16 wherein the storage medium includes a periodic array of nano-particles, and wherein each memory-center comprises a magneto-sensitive constituent associated with each nano-particle.

18. The method according to claim 17 wherein said periodic array of nano-particles includes a polymer matrix comprising a three dimensional array of rigid polymeric cores embedded in a substantially transparent shell-forming polymer.

19. The method according to claim 18 wherein said rigid polymeric cores are latex spheres.

20. The method according to claim 16 wherein the storage medium includes a homogeneous magnetic storage material.

21. The method according to claim 8 wherein the storage medium includes a periodic array of nano-particles, and wherein each memory-center comprises a photosensitive constituent associated with each nano-particle.

22. The method according to claim 21 wherein said photosensitive constituent includes chromophores.

23. The method according to claim 22 wherein said chromophores are fluorescent molecules.

24. The method according to claim 8 wherein said storage medium is a 1-, 2- or 3-dimensional storage medium.

25. The method according to claim 8 wherein said storage medium is addressed in 1-, 2- or 3-dimensions.

26. A method of reading binary information stored in an optical storage medium, comprising
a) providing an optical storage medium having n memory-centers each with a known position and the memory-centers having substantially the same physical dimensions;
b) accessing said optical storage medium with an optical addressing system and measuring for each memory-center a total optical intensity $I_m$ emitted from a pre-selected region which is centered on the known position of said memory-center and having an optical intensity distribution within a single pre-selected region $I_0(q)$ defined by a point spread function of the optical addressing system and an intensity distribution of the memory-center itself defined by an optical response of a single memory-center as imaged through an idealized optical addressing system having an infinitely small point spread function; and
c) extracting the stored binary information by calculating bit values $b_n$ for all memory-centers using an equation $\underline{B}=C^{-1}\underline{I}/I_o$, wherein $I_o$ is a predetermined normalizing factor, $\underline{I}=(I_1, I_2, \ldots, I_m, \ldots, I_n)$ is an array of said scalar intensities for all memory-centers, and $\underline{B}=(b_1, b_2, \ldots, b_n)$ is an array of bit values, and C is a predetermined cross-talk matrix of $n^2$ elements where each element represents a cross-talk between said pre-selected regions.

27. The method according to claim 26 wherein the optical intensity distribution within the single pre-selected region $I_0(q)$, is calculated as a convolution of the point spread function of the optical addressing system with the intensity distribution of the memory-center defined by the optical response of the single memory-center as measured through said idealized optical addressing system, and wherein the value of each matrix element is defined as a function of a spacing between memory-centers i and j given by $$C_{ij}=f(r')=f(|\underline{r}_i-\underline{r}_j|)=f(R_{ij})$$

where f(r') is defined as a cross-talk function, and wherein said cross-talk matrix C is calculated by applying said cross-talk function to each element of a matrix R that contains all inter-memory-center spacings $R_{ij}=r'=|\underline{r}_i-\underline{r}_j|$.

28. The method according to claim 27 wherein the cross-talk function f(r') is derived from an intensity distribution within the single pre-selected region $I_0(\underline{q}_m)$, $$f(r') = \oint d\underline{q} I_0(\underline{q}_i) I I_0(\underline{q}_j)$$

where $q_m$ defines coordinates of the intensity distribution of the pre-selected region of the mth memory-center.

29. The method according to claim 27 wherein the optical intensity distribution is a spatial intensity distribution defined as, $$I_0(x,y)=PSF(x,y)*S(x,y)=\int\int I_i(x,y)S(x'-x,y'-y)dx'dy'$$

where PSF(x,y) is the point spread function of the optical addressing system and S(x,y) is said optical intensity distribution of the single memory-center as measured through said idealized optical addressing system, and wherein the cross-talk function f(r') is derived from the spatial intensity distribution within the pre-selected regions $I_0(x,y)$, $$f(r') = 4*\int_{r/2}^{R}\int_{0}^{y(x)} Io(x, y) dy dx$$

where R is an effective radius of the optical intensity distribution.

30. The method according to claim 29 wherein the optical intensity distribution measured optically within the pre-selected regions includes discrete pixels $I_0(x,y)=I^0_{x,y}$, and wherein the cross-talk function is $$f(r') = 4*\sum_{r/2}^{R}\sum_{0}^{y(x)} I^0_{x,y},$$

where R is the effective radius of the optical intensity distribution.

31. The method according to claim 27 wherein a binary value for each memory-center is calculated from a corresponding bit value by a process wherein the $n_1$ highest bit values are assigned a binary value of '1' and all others are assigned a binary value '0' based upon an equation relating the population of '1' valued memory-centers given by, $$n_1 = \sum_{j=1}^{N} \frac{Ij}{I_0} = \frac{I_N^{total}}{I_0}.$$

32. The method according to claim 27 wherein a first row of the matrix R corresponds to the distances between the first memory-center and all other memory-centers and is calculated using integer combinations of a basis vector $\underline{R}_{1n}=A_{n\underline{a}}+B_n\underline{b}+C_n\underline{c}$, and wherein the jth row is calculated by transforming the origin from the first memory-center to the jth memory-center, $|R_{jn}|=|\underline{R}_{1n}-\underline{R}_{1j}|$.

33. The method according to claim 27 wherein said storage medium is addressed in 1-, 2- or 3-dimensions.

34. The method according to claim 27 wherein the storage medium includes a periodic array of nano-particles, and wherein each memory-center comprises a photosensitive constituent associated with each nano-particle.

35. The method according to claim 34 wherein said periodic array of nano-particles includes a polymer matrix comprising a three dimensional array of rigid polymeric cores embedded in a substantially transparent shell-forming polymer.

36. The method according to claim 35 wherein said rigid polymeric cores are latex spheres.

37. The method according to claim 34 wherein said photosensitive constituent includes chromophores.

38. The method according to claim 37 wherein said chromophores are fluorescent molecules.

39. The method according to claim 27 wherein the storage medium includes a homogeneous optical storage material.

40. The method according to claim 26 wherein said storage medium is a 1-, 2- or 3-dimensional storage medium.

* * * * *